United States Patent
Sumii et al.

(10) Patent No.: US 12,405,306 B2
(45) Date of Patent: Sep. 2, 2025

(54) SELF-DIAGNOSIS CIRCUIT AND SEMICONDUCTOR DEVICE

(71) Applicant: Rohm Co., Ltd., Kyoto (JP)

(72) Inventors: Ryosuke Sumii, Kyoto (JP); Katsuhiro Oshikawa, Kyoto (JP); Takayuki Matsuura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 189 days.

(21) Appl. No.: 18/272,432

(22) PCT Filed: Jan. 12, 2022

(86) PCT No.: PCT/JP2022/000689
§ 371 (c)(1),
(2) Date: Jul. 14, 2023

(87) PCT Pub. No.: WO2022/158347
PCT Pub. Date: Jul. 28, 2022

(65) Prior Publication Data
US 2024/0175922 A1    May 30, 2024

(30) Foreign Application Priority Data
Jan. 20, 2021 (JP) .................. 2021-006876

(51) Int. Cl.
*G01R 31/3187* (2006.01)
*G01R 31/28* (2006.01)
(Continued)

(52) U.S. Cl.
CPC ..... *G01R 31/3187* (2013.01); *G01R 31/2856* (2013.01); *G01R 31/2879* (2013.01); *G01R 31/31901* (2013.01); *G01R 31/31932* (2013.01)

(58) Field of Classification Search
CPC ............ G01R 31/2856; G01R 31/2879; G01R 31/3004; G01R 31/3187; G01R 31/31901; G01R 31/31932
See application file for complete search history.

(56) References Cited

U.S. PATENT DOCUMENTS 9,194,884 B1 * 11/2015 Mossman ................. H03F 1/52
9,575,111 B1 *  2/2017 Karp ........................ H02H 3/00
(Continued)

FOREIGN PATENT DOCUMENTS

JP    2009152129    7/2009
JP    2012175816    9/2012
(Continued)

OTHER PUBLICATIONS

International Search Report in International Appln. No. PCT/JP2022/000689, dated Mar. 8, 2022, 7 pages (with English Translation).
(Continued)

*Primary Examiner* — Thang X Le
(74) *Attorney, Agent, or Firm* — Fish & Richardson P.C.

(57) ABSTRACT

A self-diagnosis circuit (BST1) configured to diagnose a fault detection circuit (20) including a first comparator (CMP1) configured to be fed with a voltage based on a fault sensing target voltage (Vo1) and a first reference voltage (Vref1) includes a voltage switch circuit (50) configured to switch the level of a voltage based on a second reference voltage (Vref2) and output the resulting voltage, a first path switch circuit (51) configured to switch between a path through which the voltage output from the voltage switch circuit is fed to the first comparator and a path through which the voltage based on the fault sensing target voltage is fed to the first comparator, and a control circuit (15) configured to control the voltage switch circuit and the path switch circuit.

10 Claims, 6 Drawing Sheets

(51) Int. Cl.
    *G01R 31/319*     (2006.01)
    *G01R 31/3193*     (2006.01)

(56) References Cited

U.S. PATENT DOCUMENTS

2002/0118234 A1*   8/2002   DeMoor ................ B41J 29/393
                                                        347/5
2016/0061898 A1*   3/2016   Edwards ............ G01R 31/3277
                                                        324/762.09

FOREIGN PATENT DOCUMENTS

JP         2016220172       12/2016
JP         2017195654       10/2017

OTHER PUBLICATIONS

JP OA—Japanese Patent Office, Office Action in Japanese Appln. No. 2022-576619, dated Jul. 1, 2025, 6 pages (with English translation).

\* cited by examiner

SELF-DIAGNOSIS CIRCUIT AND SEMICONDUCTOR DEVICE

CROSS REFERENCE OF RELATED APPLICATIONS

This application is a U.S. National Phase application under 35 U.S.C. § 371 of International Patent Application No. PCT/JP2022/000689, filed on Jan. 12, 2022, which claims the priority of Japanese Patent Application No. JP2021-006876, filed on Jan. 20, 2021, the disclosure of which is incorporated herein by reference in its entirety.

TECHNICAL FIELD

The present disclosure relates to a self-diagnosis circuit.

BACKGROUND ART

Conventionally, various types of ICs such as power supply ICs often have fault detection/protection functions. Examples of such functions include an undervoltage detection/protection function for the output voltage of a power supply circuit, an overvoltage detection/protection function for the output voltage, an undervoltage detection/protection function (UVLO) for the supply voltage to an IC, and an overheat detection/protection function (TSD) for an IC chip (see Patent Document 1 for one example of the UVLO function).

LIST OF CITATIONS

Patent Literature

JP-A-2012-175816

SUMMARY OF THE INVENTION

Problem to be Solved by the Invention

Nowadays, in vehicle-mounted equipment and the like, a self-diagnosis (BIST: built-in self test) function is gaining importance. Thus, ICs are expected to have a self-diagnosis function for diagnosing whether a fault detection/protection function as mentioned above is functioning normally.

In view of the situation described above, the present disclosure is aimed at providing a self-diagnosis circuit that can provide an effective configuration for diagnosing whether a circuit for detecting a fault is functioning normally.

Means for Solving the Problem

According to one aspect of what is disclosed herein, a self-diagnosis circuit is configured to diagnose a fault detection circuit that includes a first comparator configured to be fed with a voltage based on a fault sensing target voltage and a first reference voltage, and includes a voltage switch circuit configured to switch the level of a voltage based on a second reference voltage and output the resulting voltage, a first path switch circuit configured to switch between a path through which the voltage output from the voltage switch circuit is fed to the first comparator and a path through which the voltage based on the fault sensing target voltage is fed to the first comparator, and a control portion configured to control the voltage switch circuit and the path switch circuit.

Advantageous Effects of the Invention

With a self-diagnosis circuit according to the present disclosure, it is possible to provide an effective configuration for diagnosing whether a circuit for detecting a fault is functioning properly.

BRIEF DESCRIPTION OF DRAWINGS

FIG. 5 is a timing chart showing one example of self-diagnosis operation in the undervoltage sense circuit in an analogue self-diagnosis mode state (A-BIST) and the like.

DESCRIPTION OF EMBODIMENTS

Exemplary embodiments of the present disclosure will be described below with reference to the accompanying drawings.

1. Comparative Example

Prior to a description of embodiments of the present disclosure, first a description will be given of a comparative example to be compared with the embodiments of the present disclosure. The description of the comparative example will help clarify the significance of the present disclosure.

Figure 6:
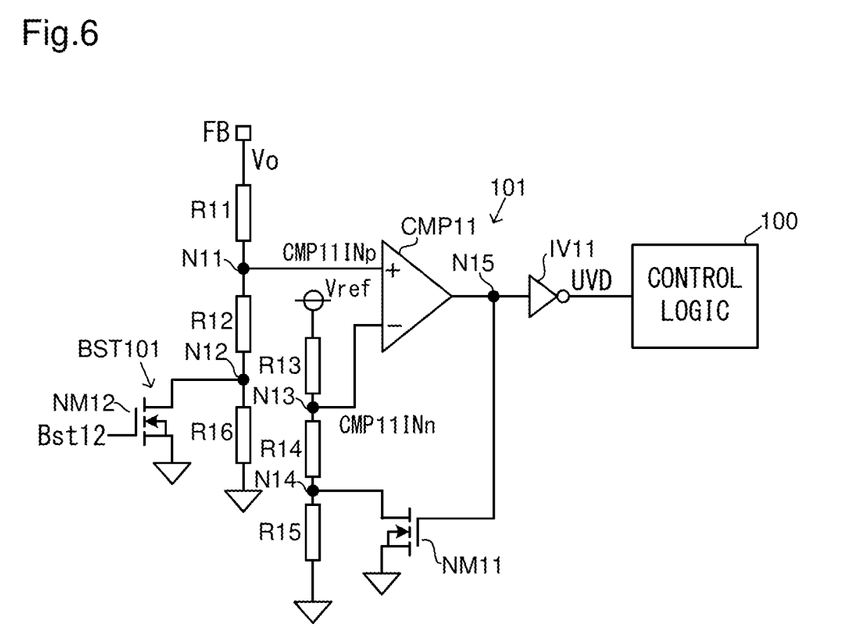
FIG. 6 is a diagram showing a configuration of a fault detection circuit according to a comparative example.

FIG. 6 is a diagram showing a configuration of a fault detection circuit according to the comparative example. FIG. 6 shows a configuration of an undervoltage sense circuit 101 as a fault detection circuit. FIG. 6 shows, in addition to the fault detection circuit, also a configuration of a self-diagnosis circuit BST101. The circuit configuration shown in FIG. 6 is included in a power supply IC. The power supply IC has a DC-DC converter function.

The undervoltage sense circuit 101 is a circuit for detecting an undervoltage in an output voltage Vo (a DC output voltage) produced by the above-mentioned DC-DC converter function. Specifically, the undervoltage sense circuit 101 includes a comparator CMP11, an inverter IV11, resistors R11 to R15, and an NMOS transistor (n-channel MOSFET (metal-oxide-semiconductor field-effect transistor)) NM11.

One terminal of the resistor R11 is connected to an FB terminal. The FB terminal is fed with the output voltage Vo. The other terminal of the resistor R11 is, at a node N11, connected to one terminal of the resistor R12. The node N11 is connected to the non-inverting input terminal (+) of the comparator CMP11. One terminal of the resistor R13 is connected to an application terminal for a reference voltage Vref. The other terminal of the resistor R13 is, at a node N13, connected to one terminal of the resistor R14. The node N13 is connected to the inverting input terminal (−) of the comparator CMP11. The output terminal of the comparator CMP11 is, at a node N15, connected to the input terminal of the inverter IV11. The node N15 is connected to the gate of the NMOS transistor NM11. The source of the NMOS transistor NM11 is connected to an application terminal for the ground potential. The drain of the NMOS transistor NM11 is connected to a node N14 to which the other terminal of the resistor R14 and one terminal of the resistor R15 are connected. The other terminal of the resistor R15 is connected to the application terminal for the ground potential.

The self-diagnosis circuit BST101 includes an NMOS transistor NM12, a resistor R16, and a control logic circuit 100. One terminal of the resistor R16 is, at a node N12, connected to the other terminal of the resistor R12. The other terminal of the resistor R16 is connected to the application terminal for the ground potential. The drain of the NMOS transistor NM12 is connected to the node N12. The source of the NMOS transistor NM12 is connected to the application terminal for the ground potential. The control logic circuit 100 applies a BIST signal Bst12, as a gate signal, to the gate of the NMOS transistor NM12.

During normal operation, the BIST signal Bst12 is low, and the NMOS transistor NM12 is off. Thus, a comparator input signal CMP11INp that appears at the node N11 as a result of the output voltage Vo being divided with the resistors R11, R12, and R16 is fed to the non-inverting input terminal (+) of the comparator CMP11.

The NMOS transistor NM11 and the resistor R15 serve to produce hysteresis. Specifically, when the output of the comparator CMP11 is low, the NMOS transistor NM11 is off, and a comparator input signal CMP11INn that appears at the node N13 as a result of the reference voltage Vref being divided with the resistors R13 to R15 is fed to the inverting input terminal (−) of the comparator CMP11. When the output of the comparator CMP11 is high, the NMOS transistor NM11 is on, and a comparator input signal CMP11INn that appears at the node N13 as a result of the reference voltage Vref being divided with the resistors R13 and R14 is fed to the inverting input terminal (−) of the comparator CMP11.

When the comparator input signal CMP11INp exceeds the comparator input signal CMP11INn to turn the output of the comparator CMP11 to high level, an undervoltage sense signal UVD, which is the output of the inverter IV11, turns to low level. By contrast, when the comparator input signal CMP11INp is equal to or lower than the comparator input signal CMP11INn and the output of the comparator CMP11 is low, the undervoltage sense signal UVD is high. The undervoltage sense signal UVD is fed to the control logic circuit 100 and, based on the undervoltage sense signal UVD being high, the control logic circuit 100 judges that the output voltage Vo is in an undervoltage fault state and performs protection operation.

In a BIST mode (diagnosis mode), the control logic circuit 100 outputs the BIST signal Bst12 at different (low and high) levels alternately. When the BIST signal Bst12 is low, the NMOS transistor NM12 is off; thus, a comparator input signal CMP11INp that appears at the node N11 as a result of the output voltage Vo being divided with the resistors R11, R12, and R16 is fed to the non-inverting input terminal (+) of the comparator CMP11.

When the BIST signal Bst12 is high, the NMOS transistor NM12 is on; thus, a comparator input signal CMP11INp that appears at the node N11 as a result of the output voltage Vo being divided with the resistors R11 and R12 is fed to the non-inverting input terminal (+) of the comparator CMP11.

Thus, while the comparator CMP11 is operating normally, after the power supply IC starts up and the output voltage Vo rises, in the BIST mode, if the BIST signal Bst12 is low, the output of the comparator CMP11 is high, and the undervoltage sense signal UVD is low. By contrast, in the BIST mode, if the BIST signal Bst12 is high, the output of the comparator CMP11 is low, and the undervoltage sense signal UVD is high.

In this way, the self-diagnosis circuit BST101 can forcibly change the level of the comparator input signal CMP11INp and sense whether the level of the undervoltage sense signal UVD changes to judge whether the undervoltage sense circuit 101 is operating normally.

However, the self-diagnosis operation described above is to be performed after the output voltage Vo has risen up and stabilized. In that case, the self-diagnosis operation takes a certain time; thus, if there is a fault in the fault detection function, before a fault in the fault detection function is found by self-diagnosis and the IC is shut down, an abnormal output voltage Vo may be output.

One possible solution is to perform the self-diagnosis operation before the output voltage Vo rises up. In this case, when there is a fault in the fault detection function, the IC can be shut down without raising the output voltage Vo. However, the output voltage Vo is left indefinite in accordance with the timing at which the IC starts up, and, depending on the output voltage Vo, the self-diagnosis operation may not operate properly. For example, when the output voltage Vo is 0 V during start-up, with the configuration shown in FIG. 6, switching the level of the BIST signal Bst12 only makes the comparator input signal CMP11INp 0V; thus, it is not possible to switch the output logic level of the comparator CMP11. That is, the self-diagnosis operation cannot be performed.

In view of the above problems found out through an unparalleled study, the present inventors have devised a configuration that permits self-diagnosis operation regardless of the value of a fault sensing target voltage (the output voltage Vo in the example in FIG. 6) as the target of fault sensing by a fault detection circuit. Now, embodiments of the present disclosure will be described.

2. Configuration of a PMIC

Figure 1:
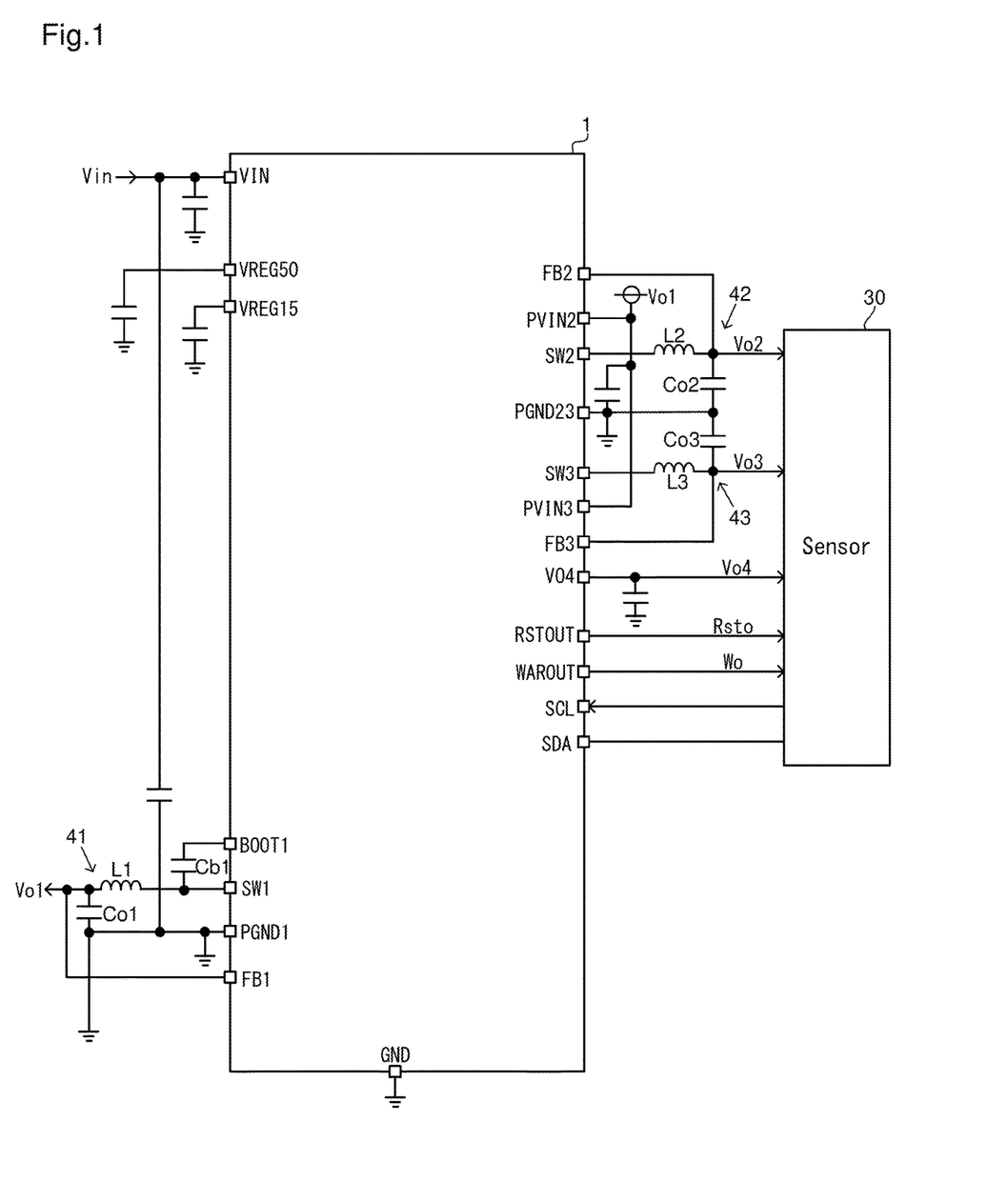
FIG. 1 is a diagram showing a configuration with respect to the external connection of a PMIC according to an exemplary embodiment of the present disclosure.
Figure 2:
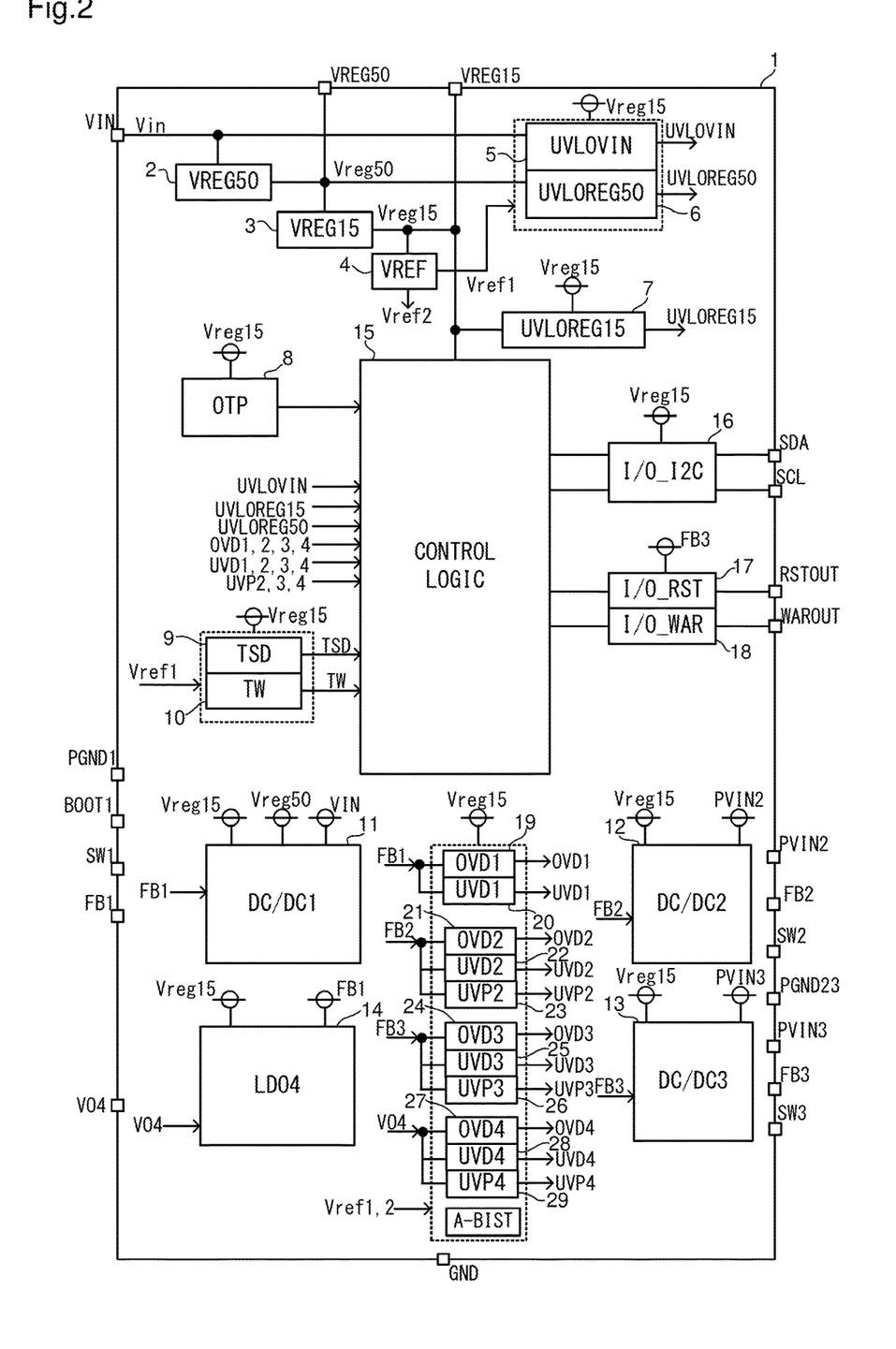
FIG. 2 is a diagram showing an internal configuration of the PMIC according to the exemplary embodiment of the present disclosure.

Here, a configuration of a PMIC (power management IC) according to an exemplary embodiment of the present disclosure will be described. FIG. 1 is a diagram showing a configuration with respect to the external connection of the PMIC 1 according to the exemplary embodiment of the present disclosure. FIG. 2 is a diagram showing an internal configuration of the PMIC 1.

The PMIC 1 shown in FIGS. 1 and 2 is a semiconductor device (power supply IC package) including a plurality of power supply circuits for supplying electric power to a vehicle-mounted CMOS sensor device 30. The CMOS sensor device 30 is incorporated in a vehicle-mounted camera system.

As shown in FIG. 1, the PMIC 1 has, as external terminals for establishing electrical connection with the outside, a VIN terminal, a VREG50 terminal, a VREG15 terminal, a BOOT1 terminal, an SW1 terminal, a PGND1 terminal, an FB1 terminal, an FB2 terminal, a PVIN2 terminal, an SW2 terminal, a PGND23 terminal, an SW3 terminal, a PVIN3 terminal, an FB3 terminal, a VO4 terminal, a RSTOUT terminal, a WAROUT terminal, an SCL terminal, an SDA terminal, and a GND terminal.

As shown in FIG. 2, the PMIC 1 includes an internal voltage generator 2, an internal voltage generator 3, a reference voltage generator 4, a supply voltage UVLO (undervoltage lock-out) circuit 5, an internal voltage UVLO circuit 6, an internal voltage UVLO circuit 7, an OTP (one-time programmable ROM) 8, a TSD (thermal shut-down) circuit 9, a TW (thermal warning) circuit 10, a first DC-DC circuit 11, a second DC-DC circuit 12, a third DC-DC circuit 13, an LDO (low dropout) 14, a control logic circuit 15, an I2C input/output circuit 16, a reset input/output circuit 17, and a warning input/output circuit 18.

The PMIC 1 further includes, as shown in FIG. 2, a first overvoltage sense circuit 19, a first undervoltage sense circuit 20, a second overvoltage sense circuit 21, a second undervoltage sense circuit 22, a second undervoltage protection circuit 23, a third overvoltage sense circuit 24, a third undervoltage sense circuit 25, a third undervoltage protection circuit 26, a fourth overvoltage sense circuit 27, a fourth undervoltage sense circuit 28, and a fourth undervoltage protection circuit 29.

The VIN terminal is connected to an application terminal for a supply voltage (input supply voltage) Vin. The internal voltage generator 2 generates an internal voltage Vreg50 (=5.0 V) based on the supply voltage Vin fed in via the VIN terminal. The internal voltage Vreg50 serves as the supply voltage to the internal voltage generator 3 and the first DC-DC circuit 11. The internal voltage Vreg50 can be fed out via the VREG50 terminal.

The internal voltage generator 3 generates an internal voltage Vreg15 (=1.5 V) based on the internal voltage Vreg50. The internal voltage Vreg15 serves as the supply voltage to different parts in the PMIC 1. The internal voltage Vreg15 is used as a reference voltage in the first, second, and third DC-DC circuits 11, 12, and 13 and in the LDO 14. The internal voltage Vreg15 can be fed out via the VREG15 terminal.

The reference voltage generator 4 generates a first reference voltage Vref1 and a second reference voltage Vref2 based on the internal voltage Vreg15. The first reference voltage Vref1 is used as a reference voltage in different fault detection circuits and the fault protection circuits in the PMIC 1. The second reference voltage Vref2 is used as a reference voltage in the self-diagnosis circuit described later.

The supply voltage UVLO circuit 5 is a fault protection circuit for detecting a low voltage fault in the supply voltage Vin. The supply voltage UVLO circuit 5 outputs a UVLO signal UVLOVIN to the control logic circuit 15. When a low voltage fault is detected in the supply voltage Vin, the control logic circuit 15 shuts down the IC.

The internal voltage UVLO circuit 6 is a fault protection circuit for detecting a low voltage fault in the internal voltage Vreg50. The internal voltage UVLO circuit 6 outputs a UVLO signal UVLOREG50 to the control logic circuit 15. When a low voltage fault is detected in the internal voltage Vreg50, the control logic circuit 15 carries out a shift to a safe mode state.

The internal voltage UVLO circuit 7 is a fault protection circuit for detecting a low voltage fault in the internal voltage Vreg15. The internal voltage UVLO circuit 7 outputs a UVLO signal UVLOREG15 to the control logic circuit 15. When a low voltage fault is detected in the internal voltage Vreg15, the control logic circuit 15 carries out a shift to a stand-by state.

An OTP 8 is a one-time writable ROM, which stores various kinds of data. The control logic circuit 15 reads data from the OTP 8.

The TSD circuit 9 is an overheat protection circuit and outputs an overheat protection signal TSD to the control logic circuit 15. When the TSD circuit 9 senses that the junction temperature of an IC chip has exceeded a first predetermined temperature (for example, 175° C.), the control logic circuit 15 shuts down the IC.

The TW circuit 10 is an overheat sense circuit and outputs an overheat warning signal TW to the control logic circuit 15. On sensing that the junction temperature of the IC chip has exceeded a second predetermined temperature (higher than the first predetermined temperature, for example, 140° C., the TW circuit 10 warns of an overheat fault.

The first DC-DC circuit 11, together with an inductor L1, an output capacitor Co1, and a boot capacitor Cb1 arranged outside the PMIC 1, constitutes a first DC-DC converter 41 (see FIG. 1). The first DC-DC converter 41 is a buck (step-down) converter that takes as its input the supply voltage Vin (for example, 15.0 V) and that outputs an output voltage Vo1 (for example, 3.7 V).

The SW1 terminal is a terminal to which the switching output of the first DC-DC circuit 11 is fed. The SW1 terminal is connected to one terminal of the inductor L1. The other terminal of the inductor L1 is connected to one terminal of the output capacitor Co1. The other terminal of the output capacitor Co1 is connected to the PGND1 terminal. The PGND1 terminal is connected to the application terminal for the ground potential and is a ground terminal for the first DC-DC circuit 11. The boot capacitor Cb1 constitutes a bootstrap. One terminal of the boot capacitor Cb1 is connected to the BOOT1 terminal. The other terminal of the boot capacitor Cb1 is connected to the SW1 terminal. A boot voltage that appears at the BOOT1 terminal is fed to a high-side driver in the first DC-DC circuit 11.

Through switching control by the first DC-DC circuit 11, the output voltage Vo1 appears at the node to which the inductor L1 and the output capacitor Co1 are connected. The output voltage Vo1 is fed to the PVIN2 terminal and to the PVIN3 terminal as the input power sources for the second and third DC-DC circuits 12 and 13 respectively.

The output voltage Vo1 is fed to the FB1 terminal. The FB1 terminal is a terminal for feeding the output voltage Vo1 back to the first DC-DC circuit 11. The output voltage Vo1 fed to the FB1 terminal is used also as the input power source for the LDO 14.

The second DC-DC circuit 12, together with an inductor L2 and an output capacitor Co2 arranged outside the PMIC 1, constitutes a second DC-DC converter 42 (see FIG. 1). The second DC-DC converter 42 is a buck (step-down) converter that takes as its input the output voltage Vo1 fed to the PVIN2 terminal and that outputs an output voltage Vo2 (for example, 1.1 V).

The SW2 terminal is a terminal to which the switching output of the second DC-DC circuit 12 is fed. The SW2 terminal is connected to one terminal of the inductor L2. The other terminal of the inductor L2 is connected to one terminal of the output capacitor Co2. The other terminal of the output capacitor Co2 is connected to the PGND23 terminal. The PGND23 terminal is connected to the application terminal for the ground potential and is a ground terminal for the second and third DC-DC circuits 12 and 13.

Through switching control by the second DC-DC circuit 12, the output voltage Vo2 appears at the node to which the inductor L2 and the output capacitor Co2 are connected. The output voltage Vo2 is fed to the CMOS sensor device 30 as the supply voltage. The output voltage Vo2 is fed to the FB2 terminal. The FB2 terminal is a terminal for feeding the output voltage Vo2 back to the second DC-DC circuit 12.

The third DC-DC circuit 13, together with an inductor L3 and an output capacitor Co3 arranged outside the PMIC 1, constitutes a third DC-DC converter 43 (see FIG. 1). The third DC-DC converter 43 is a buck (step-down) converter that takes as its input the output voltage Vo1 fed to the PVIN3 terminal and outputs an output voltage Vo3 (for example, 1.8 V).

The SW3 terminal is a terminal to which the switching output of the third DC-DC circuit 13 is fed. The SW3 terminal is connected to one terminal of the inductor L3. The other terminal of the inductor L3 is connected to one terminal of the output capacitor Co3. The other terminal of the output capacitor Co3 is connected to the PGND23 terminal.

Through switching control by the third DC-DC circuit 13, the output voltage Vo3 appears at the node to which the inductor L3 and the output capacitor Co3 are connected. The output voltage Vo3 is fed to the CMOS sensor device 30 as the supply voltage. The output voltage Vo3 is fed to the FB3 terminal. The FB3 terminal is a terminal for feeding the output voltage Vo3 back to the third DC-DC circuit 13.

The LDO 14 is a linear regulator that takes as its input the output voltage Vo1 fed to the FB1 terminal and that outputs an output voltage Vo4 (for example, 3.3 V). The output voltage Vo4 is fed out via the VO4 terminal to be fed to the CMOS sensor device 30 as the supply voltage. The VO4 terminal is used also as a terminal for feeding the output voltage Vo4 back to the LDO 14.

The control logic circuit 15 is a control circuit that controls the PMIC 1 comprehensively.

The I2C input/output circuit 16 performs I2C communication with the CMOS sensor device 30 via the SDA and SCL terminals. I2C is a kind of serial interface. The SDA terminal is used for input and output of serial interface data. The SCL terminal is used for input of a serial interface clock.

The reset input/output circuit 17 outputs a reset output signal Rsto to the CMOS sensor device 30 via the RSTOUT terminal. The reset output signal Rsto is, as will be described later, at a level (for example, low) indicating a fault on its detection by the fault protection circuit.

The warning input/output circuit 18 outputs a warning output signal Wo to the CMOS sensor device 30 via the WAROUT terminal. The warning output signal Wo is, as will be described later, at a level (for example, low) indicating a fault on its detection by the fault detection circuit or the fault protection circuit.

3. Fault Detection Circuit

The first overvoltage sense circuit 19, the second overvoltage sense circuit 21, the third overvoltage sense circuit 24, and the fourth overvoltage sense circuit 27 are fault detection circuits for detecting an overvoltage fault.

The first overvoltage sense circuit 19 is a circuit for detecting an overvoltage in the output voltage Vo1 fed to the FB1 terminal and outputs an overvoltage sense signal OVD1. The second overvoltage sense circuit 21 is a circuit for detecting an overvoltage in the output voltage Vo2 fed to the FB2 terminal and outputs an overvoltage sense signal OVD2. The third overvoltage sense circuit 24 is a circuit for detecting an overvoltage in the output voltage Vo3 fed to the FB3 terminal and outputs an overvoltage sense signal OVD3. The fourth overvoltage sense circuit 27 is a circuit for detecting an overvoltage in the output voltage Vo4 fed to the VO4 terminal and outputs an overvoltage sense signal OVD4.

The first undervoltage sense circuit 20, the second undervoltage sense circuit 22, the third undervoltage sense circuit 25, and the fourth undervoltage sense circuit 28 are fault detection circuits for detecting an undervoltage fault.

The first undervoltage sense circuit 20 is a circuit for detecting an undervoltage in the output voltage Vo1 fed to the FB1 terminal and outputs an undervoltage sense signal UVD1. The second undervoltage sense circuit 22 is a circuit for detecting an undervoltage in the output voltage Vo2 fed to the FB2 terminal and outputs an undervoltage sense signal UVD2. The third undervoltage sense circuit 25 is a circuit for detecting an undervoltage in the output voltage Vo3 fed to the FB3 terminal and outputs an undervoltage sense signal UVD3. The fourth undervoltage sense circuit 28 is a circuit for detecting an undervoltage in the output voltage Vo4 fed to the VO4 terminal and outputs an undervoltage sense signal UVD4.

The TW circuit 10 is a fault detection circuit for detecting an overheat fault.

When a fault is detected by any of the fault detection circuits described above, the control logic circuit 15, while maintaining an active state (normal operation state), outputs the warning output signal Wo at a level (for example, low) indicating a fault to warn the CMOS sensor device 30. Here, the reset output signal Rsto is at a level (for example, high) indicating normal operation.

4. Fault Protection Circuit

The second undervoltage protection circuit 23, the third undervoltage protection circuit 26, and the fourth undervoltage protection circuit 29 are fault protection circuits for detecting an undervoltage fault.

The second undervoltage protection circuit 23 is a circuit for detecting an undervoltage in the output voltage Vo2 fed to the FB2 terminal and outputs an undervoltage protection signal UVP2. The third undervoltage protection circuit 26 is a circuit for detecting an undervoltage in the output voltage Vo3 fed to the FB3 terminal and outputs an undervoltage protection signal UVP3. The fourth undervoltage protection circuit 29 is a circuit for detecting an undervoltage in the output voltage Vo4 fed to the VO4 terminal and outputs an undervoltage protection signal UVP4.

The supply voltage UVLO circuit 5, the internal voltage UVLO circuits 6, 7, and the TSD circuit 9 are all fault protection circuits.

When a fault is detected by any of the fault protection circuits described above, the control logic circuit 15 carries out a shift to one of the shut-down state, the safe mode state, and the stand-by state. When a fault is detected by one of the undervoltage protection circuits described above, the control logic circuit 15 carries out a shift to the safe mode. Here, the control logic circuit 15 switches the warning output signal Wo and the reset output signal Rsto both to a level (for example, low) indicating a fault and notifies the CMOS sensor device 30 of the fault.

Here, the fault protection circuit has a function of detecting a fault, and thus it can be understood as a fault detection circuit.

5. Self-Diagnosis Function

The PMIC 1 according to the embodiment has a self-diagnosis (BIST: Built-In Self Test) function for diagnosing whether the fault detection circuits and the fault protection circuits are operating normally. Now, the self-diagnosis function will be described.

As shown in FIG. 2, self-diagnosis circuits are provided so as to correspond to the first to fourth overvoltage sense circuits 19, 21, 24, and 27, the first to fourth undervoltage sense circuits 20, 22, 25, 28, and the second to fourth undervoltage protection circuits 23, 26, and 29 (see "A-BIST" in FIG. 2).

5-1. Configuration of the Self-Diagnosis Circuit

Here, with reference to FIG. 3, a configuration of a self-diagnosis circuit BST1 for diagnosing the undervoltage sense circuit 20 and the overvoltage sense circuit 19 will be described.

The undervoltage sense circuit 20 includes the comparator CMP1, the inverter IV1, the resistors R1 to R3, and the NMOS transistor NM1. More specifically, one terminal of the resistor R1 is connected to the FB1 terminal. The other terminal of the resistor R1 is, at the node N1, connected to one terminal of the resistor R2. The node N1 is connected to one terminal of a second path switch SW_UVD2 included in the self-diagnosis circuit BST1, which will be described later. The other terminal of the second path switch SW_UVD2 is, at a node N3, connected to the non-inverting input terminal (+) of the comparator CMP1. The inverting input terminal (−) of the comparator CMP1 is connected to the application terminal for the first reference voltage Vref1 generated by the reference voltage generator 4. The output terminal of the comparator CMP1 is connected to the input terminal of the inverter IV1.

The NMOS transistor NM1 and the resistor R3 serve to produce hysteresis. The output terminal of the inverter IV1 is connected to the gate of the NMOS transistor NM1. The source of the NMOS transistor NM1 is connected to the application terminal for the ground potential. The drain of the NMOS transistor NM1 is connected to a node N2 to which the other terminal of the resistor R2 and one terminal of the resistor R3 are connected. The other terminal of the resistor R3 is connected to the application terminal for the ground potential.

The self-diagnosis circuit BST1 includes a first path switch SW_UVD1, a second path switch SW_UVD2, a first path switch SW_OVD1, a second path switch SW_OVD2, a high-side switch SW_BIST_H, a low-side switch SW_BIST_L, resistors R7 to R9, and a control logic circuit 15. The first path switch SW_UVD1, the second path switch SW_UVD2, the first path switch SW_OVD1, the second path switch SW_OVD2, the high-side switch SW_BIST_H, and the low-side switch SW_BIST_L are turned on and off by the control logic circuit 15.

One terminal of the resistor R7 is connected to an application terminal for the second reference voltage Vref2 generated by the reference voltage generator 4. The other terminal of the resistor R7 is, at a node N4, connected to one terminal of the resistor R8. The other terminal of the resistor R8 is, at a node N5, connected to one terminal of the resistor R9. The other terminal of the resistor R9 is connected to the application terminal for the ground potential.

The node N4 is connected to one terminal of the high-side switch SW_BIST_H. The other terminal of the high-side switch SW_BIST_H is, at a node N6, connected to one terminal of the first path switch SW_UVD1. The other terminal of the first path switch SW_UVD1 is connected to the node N3.

The node N5 is connected to one terminal of the low-side switch SW_BIST_L. The other terminal of the low-side switch SW_BIST_L is, at a node N7, connected to the node N6.

The overvoltage sense circuit 19 includes a comparator CMP2, an inverter IV2, resistors R4 to R6, and the NMOS transistor NM2.

The interconnections in the overvoltage sense circuit 19 is similar to those in the undervoltage sense circuit 20; thus, no overlapping description will be repeated. The node N7 is connected to one terminal of the first path switch SW_OVD1. The other terminal of the first path switch SW_OVD1 is connected to a node N8 to which the second path switch SW_OVD2 and the non-inverting input terminal (+) of the comparator CMP2 are connected.

5-2. Operation of Fault Detection Circuit and Self-Diagnosis Circuit

Next, the operation of the above configuration shown in FIG. 3 will be described. In normal operation or the like, the first path switch SW_UVD1 is off and the second path switch SW_UVD2 is on. In this case, the high-side switch SW_BIST_H and the low-side switch SW_BIST_L are both off. In this way, the voltage generated by dividing the output voltage Vo1 fed to the FB1 terminal with the resistors R1 to R3 is fed via the second path switch SW_UVD2 to, as a comparator input signal CMP1IN, the non-inverting input terminal (+) of the comparator CMP1. The comparator CMP1 compares the comparator input signal CMP1IN with the first reference voltage Vref1.

Thus, when the comparator input signal CMP1IN, which is a voltage based on the output voltage Vo1, is higher than the first reference voltage Vref1, the output of the comparator CMP1 is high and the undervoltage sense signal UVD1, which is the output of the inverter IV1, is low. By contrast, when the comparator input signal CMP1IN is equal to or lower than the first reference voltage Vref1, the output of the comparator CMP1 is low and the undervoltage sense signal UVD1, which is the output of the inverter IV1, is high. The undervoltage sense signal UVD1 is fed to the control logic circuit 15. In this way, when an undervoltage occurs in the output voltage Vo1, it is possible to notify the control logic circuit 15 of the undervoltage sense signal UVD1 at high level indicating a fault.

In normal operation or the like, the first path switch SW_OVD1 is off and the second path switch SW_OVD2 is on. In this case, the voltage generated by dividing the output voltage Vo1 fed to the FB1 terminal with the resistors R4 to R6 is fed via the second path switch SW_OVD2 to, as a comparator input signal CMP2IN, the non-inverting input terminal (+) of the comparator CMP2. The comparator CMP2 compares the comparator input signal CMP2IN with the first reference voltage Vref1.

Thus, when the comparator input signal CMP2IN, which is a voltage based on the output voltage Vo1, is equal to or lower than the first reference voltage Vref1, the overvoltage sense signal OVD1, which is the output of the comparator CMP2, is low. By contrast, when the comparator input signal CMP2IN is higher than the first reference voltage Vref1, the overvoltage sense signal OVD1, which is the output of the comparator CMP2, is high. The overvoltage sense signal OVD1 is fed to the control logic circuit 15. In this way, when an overvoltage occurs in the output voltage Vo1, it is possible to notify the control logic circuit 15 of the overvoltage sense signal OVD1 at high level indicating a fault.

During the self-diagnosis operation by the undervoltage sense circuit 20, the control logic circuit 15 keeps the first path switch SW_UVD1 on and the second path switch SW_UVD2 off. The control logic circuit 15 keeps the first path switch SW_OVD1 off. In this case, the control logic circuit 15 switches between a first state in which the high-side switch SW_BIST_H is on and the low-side switch SW_BIST_L is off and a second state in which the high-side switch SW_BIST_H is off and the low-side switch SW_BIST_L is on.

In this way, in the first state, the voltage (a voltage with a first level) generated at the node N4 by dividing the second reference voltage Vref2 with the resistors R7 to R9 is fed via the high-side switch SW_BIST_H and the first path switch SW_UVD1 to, as the comparator input signal CMP1IN, the non-inverting input terminal (+) of the comparator CMP1. In this case, if the comparator CMP1 is operating normally, the output of the comparator CMP1 is high, and the undervoltage sense signal UVD1 is low.

By contrast, in the second state, the voltage (a voltage with a second level) generated at the node N5 by dividing the second reference voltage Vref2 with the resistors R7 to R9 is fed via the low-side switch SW_BIST_L and the first path switch SW_UVD1 to, as the comparator input signal CMP1IN, the non-inverting input terminal (+) of the comparator CMP1. In this case, if the comparator CMP1 is operating normally, the output of the comparator CMP1 is low, and the undervoltage sense signal UVD1 is high.

Thus, the control logic circuit 15 can check whether the level of the undervoltage sense signal UVD1 has been switched between high and low to diagnose whether the undervoltage sense circuit 20 is normal.

During the self-diagnosis operation by the overvoltage sense circuit 19, the control logic circuit 15 keeps the first path switch SW_OVD1 on and the second path switch SW_OVD2 off. The control logic circuit 15 keeps the first path switch SW_UVD1 off. In this case, the control logic circuit 15 switches between the first and second states described above.

In this way, in the first state described above, the voltage generated at the node N4 by dividing the second reference voltage Vref2 with the resistors R7 to R9 is fed via the high-side switch SW_BIST_H and the first path switch SW_OVD1 to, as the comparator input signal CMP2IN, the non-inverting input terminal (+) of the comparator CMP2. In this case, if the comparator CMP2 is operating normally, the overvoltage sense signal OVD1, which is the output of the comparator CMP2, is high.

By contrast, in the second state described above, the voltage generated at the node N5 by dividing the second reference voltage Vref2 with the resistors R7 to R9 is fed via the low-side switch SW_BIST_L and the first path switch SW_OVD1 to, as the comparator input signal CMP2IN, the non-inverting input terminal (+) of the comparator CMP2. In this case, if the comparator CMP2 is operating normally, the overvoltage sense signal OVD1, which is the output of the comparator CMP2, is low.

Thus, the control logic circuit 15 can check whether the level of the overvoltage sense signal OVD1 has been switched between high and low to diagnose whether the overvoltage sense circuit 19 is normal.

In this way, in the embodiment, the resistors R7 to R9, the high-side switch SW_BIST_H, and the low-side switch SW_BIST_L constitute a voltage switch circuit 50 that switches the level of a voltage that is based on the second reference voltage Vref2 and that outputs the resulting voltage. The first path switches SW_UVD1 and SW_OVD1 and the second path switches SW_UVD2 and SW_OVD2 constitute path switch circuits 51 and 52 that switch between the first path through which a voltage based on the second reference voltage Vref2 is fed to the comparator and the second path through which a voltage based on the output voltage Vo1 is fed to the comparator. The first path switch circuit 51 is constituted by the first and second path switches SW_UVD1 and SW_UVD2. The second path switch circuit 52 is constituted by the first and second path switches SW_OVD1 and SW_OVD2.

In self-diagnosis operation, the first path switches SW_UVD1 and SW_OVD1 are kept on and the second path switches SW_UVD2 and SW_OVD2 are kept off, so that the second path is cut off and the first path is secured. In that state, the first and second states are switched with the high-side switch SW_BIST_H and the low-side switch SW_BIST_L, so that the voltage switch circuit 50 outputs a voltage with a different level regardless of the output voltage Vo1 to feed the resulting voltage to the comparator. In this way, the control logic circuit 15 can diagnose the fault detection circuit based on whether the output level of the comparator is switched.

In this way, in the embodiment, it is possible to diagnose the fault detection circuit regardless of the value of the output voltage Vo1, which is a fault sensing target voltage. Thus, as will be described later, it is possible to perform self-diagnosis operation before the output voltage Vo1 rises during IC start-up.

5-3. Modified Example, etc.

Self-diagnosis operation for the undervoltage sense circuit 20 and self-diagnosis operation for the overvoltage sense circuit 19 are performed in temporal sequence but in any order.

Switching between the first and second states with the high-side switch SW_BIST_H and the low-side switch SW_BIST_L can be started in either state, and switching can be performed any number of times more than once.

In the fault detection circuit different from the one that performs self-diagnosis operation, the on/off states of the second path switches SW_UVD2 and SW_OVD2 do not matter.

Figure 3:
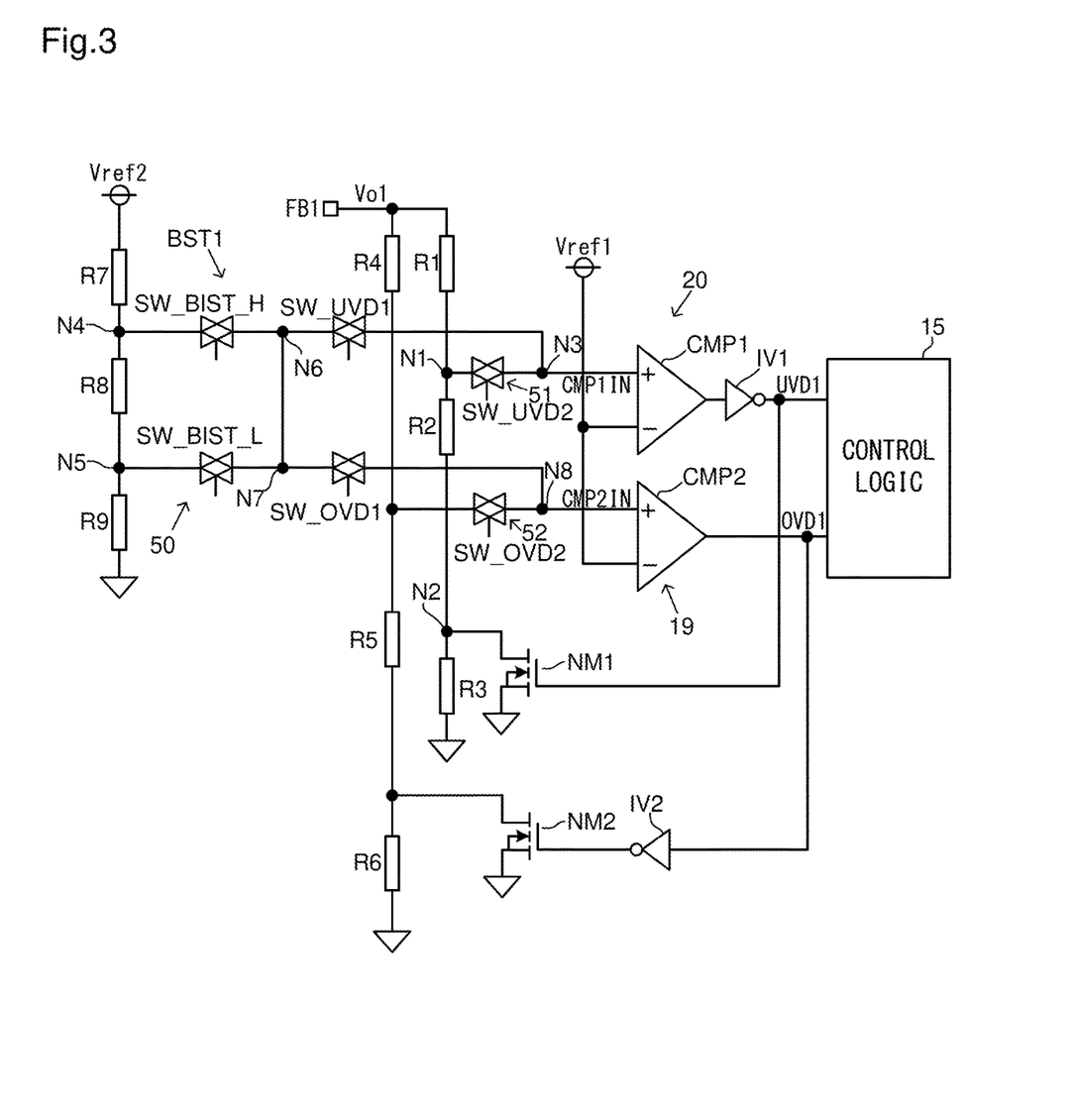
FIG. 3 is a diagram showing a configuration of a self-diagnosis circuit for diagnosing an undervoltage sense circuit and an overvoltage sense circuit.

Also the second overvoltage sense circuit 21 and the second undervoltage sense circuit 22 can be provided with self-diagnosis circuits with a configuration similar to that in FIG. 3. For the second undervoltage protection circuit 23 and its self-diagnosis circuit, circuit blocks similar to the first undervoltage sense circuit 20, the first path switch SW_UVD1, and the second path switch SW_UVD2 shown in FIG. 3 can be added to the second overvoltage sense circuit 21 and the second undervoltage sense circuit 22.

The third overvoltage sense circuit 24, the third undervoltage sense circuit 25, the third undervoltage protection circuit 26, and their self-diagnosis circuits, as well as the fourth overvoltage sense circuit 27, the fourth undervoltage sense circuit 28, the fourth undervoltage protection circuit 29, and their self-diagnosis circuits can be configured similarly to the second overvoltage sense circuit 21, the second undervoltage sense circuit 22, the second undervoltage protection circuit 23, and their self-diagnosis circuits.

Although, in the above embodiment, the fault detection target voltages are the output voltages Vo1 and Vo4 of the power supply circuit, this is not meant as any limitation; instead, a self-diagnosis circuit can be configured in a similar way as described above with respect to, as a target voltage, the supply voltage Vin, the internal voltage (e.g. Vreg50), or a detection voltage of the junction temperature. That is, a self-diagnosis circuit can be applied to a UVLO circuit or an overheat sense/protection circuit.

6. An Example of Operation During IC Start-Up

Figure 4:
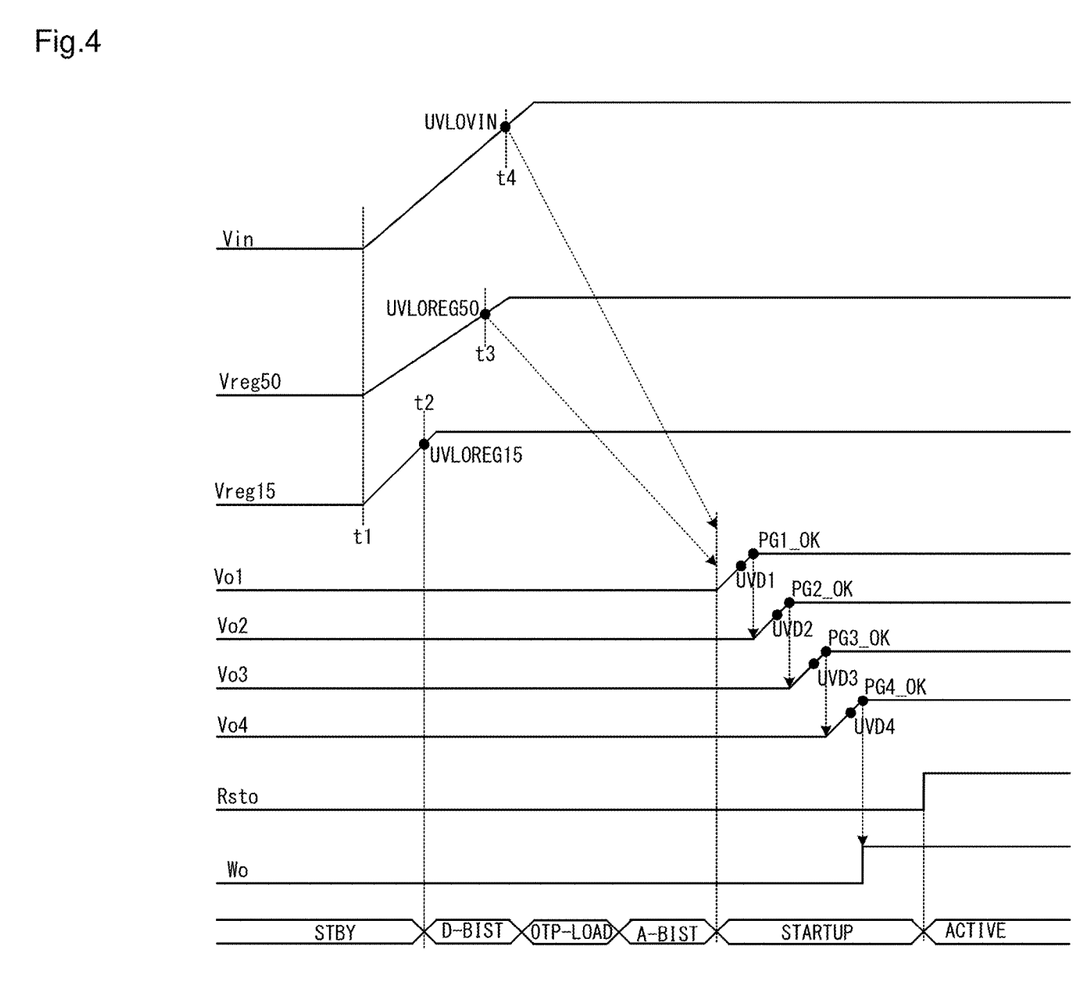
FIG. 4 is a timing chart showing an example of operation of the PMIC during start-up.

FIG. 4 is a timing chart showing an example of the operation of the PMIC 1 during start-up. In FIG. 4, first, the control logic circuit 15 is in a stand-by state, and the IC is out of operation. In this state, when, at time point t1, the supply voltage Vin starts rising, together with it, also the internal voltages Vreg50 and Vreg15 start rising.

Then, when, at time point t2, UVLO release with respect to the internal voltage Vreg15 is detected by the internal voltage UVLO circuit 7, the control logic circuit 15 makes a shift from the stand-by state to a digital self-diagnosis mode state (D-BIST).

If, in the digital self-diagnosis mode state, the diagnosis result is normal, the control logic circuit 15 makes a shift to an OTP load state. Here, the control logic circuit 15 reads data from an OTP 8 and initializes the settings.

When the OTP load state ends, the control logic circuit 15 carries out a shift to an analogue self-diagnosis mode state (A-BIST). In the analogue self-diagnosis mode state, self-diagnosis operation is performed with respect to the various overvoltage sense circuits, undervoltage sense circuits, and undervoltage protection circuits described earlier. Here, self-diagnosis operation with respect to the UVLO circuit and the overheat fault sense/protection circuit may be performed as described earlier.

If, in the analogue self-diagnosis mode state, the diagnosis results are normal with respect to all the circuits and in addition the supply voltage Vin and the internal voltage Vreg50 are in a UVLO release state, the control logic circuit 15 carries out a shift from the analogue self-diagnosis mode state to a start-up state.

In the start-up state, the control logic circuit 15 controls the first to third DC-DC circuits 11, 12, and 13 and the LDO 14 to raise the output voltages Vo1 to Vo4 in this order. More specifically, first, the control logic circuit 15 starts raising the output voltage Vo1 and, on detecting that the output voltage Vo1 is released from an undervoltage state and the output voltage Vo1 has risen normally, it starts raising the output voltage Vo2. Then, on detecting that the undervoltage state of the output voltage Vo2 is released and the output voltage Vo2 has risen normally, the control logic circuit 15 starts raising the output voltage Vo3. Then, on detecting that the undervoltage state of the output voltage Vo3 is released and the output voltage Vo3 has risen normally, the control logic circuit 15 starts raising the output voltage Vo4.

Then, on detecting that the undervoltage state of the output voltage Vo4 is released and the output voltage Vo4 has risen normally, the control logic circuit 15 raises the warning output signal Wo to high level. If no fault is detected by the fault protection circuit after the warning output signal Wo is raised to high level until a predetermined delay time passes, the control logic circuit 15 raises the reset output signal Rsto to high level and carries out a shift from the start-up state to the active state (normal operation state).

In this way, with the startup operation shown in FIG. 4, it is possible to perform self-diagnosis operation (A-BIST) before the output voltages Vo1 to Vo4 rise. Thus, it is possible to perform diagnosis without outputting abnormal output voltages Vo1 to Vo4. When the diagnosis result indicates a fault, the control logic circuit 15 carries out a shift to the safe mode.

7. Example of Self-Diagnosis Operation

Figure 5:
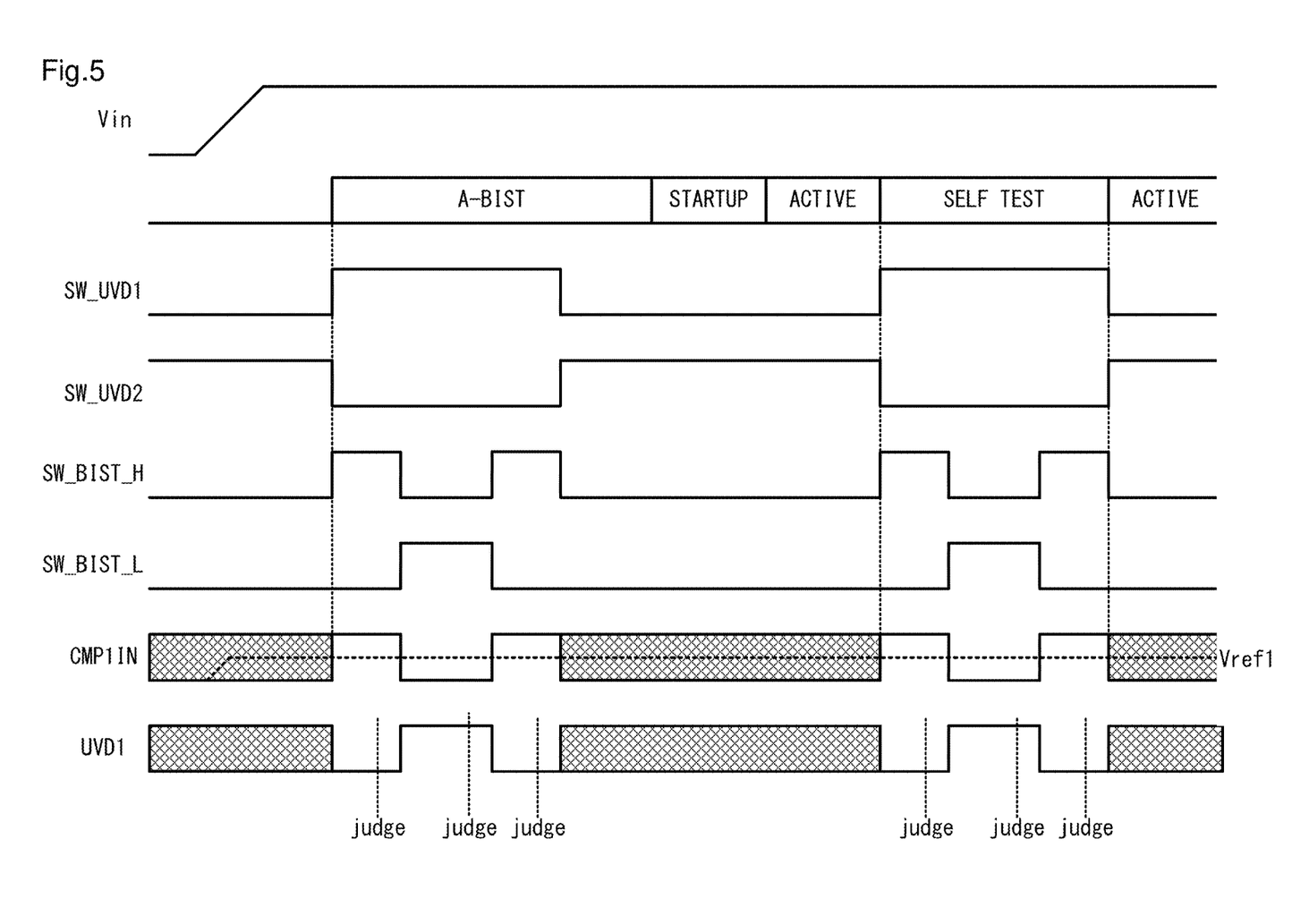

FIG. 5 is a timing chart showing one example of the self-diagnosis operation in the first undervoltage sense circuit 20 (FIG. 3) in the analogue self-diagnosis mode state (A-BIST) and the like. In FIG. 5, for switches, high level indicates the on-state and low level the off-state.

As shown in FIG. 5, in the analogue self-diagnosis mode state, the first path switch SW_UVD1 is on, and the second path switch SW_UVD2 is off. By contrast, the on/off states of the high-side switch SW_BIST_H and the low-side switch SW_BIST_L are switched from the first state to the second state and then to the first state. Thus, the comparator input signal CMP1IN is switched from high to low and then to high. In the example in FIG. 5, the comparator CMP11 is normal; thus, the undervoltage sense signal UVD1 is switched from low to high and then to low. Accordingly, the control logic circuit 15 diagnoses the undervoltage sense circuit 20 as normal.

As shown in FIG. 5, the control logic circuit 15 can carry out a shift from the active state to the self-diagnosis mode state (SELF TEST). This shift is performed in accordance with an instruction from the CMOS sensor device 30 by I2C communication. Also in this self-diagnosis mode state, as in the analogue self-diagnosis mode state, self-diagnosis operation for the undervoltage sense circuit 20 is performed.

8. Other Modifications

The various technical features disclosed herein may be implemented in any other manners than in the embodiments described above, and allow for any modifications made without departure from their technical ingenuity. That is, the above embodiments should be understood to be in every aspect illustrative and not restrictive. The scope of the present disclosure is defined not by the description of the embodiments given above but by the appended claims, and should be understood to encompass any modifications made in a sense and scope equivalent to those of the claims.

9. Notes

As described above, for example, according to one aspect of what is disclosed herein, a self-diagnosis circuit (BST1) is configured to diagnose a fault detection circuit (20) including a first comparator (CMP1) configured to be fed with a voltage based on a fault sensing target voltage (Vo1) and a first reference voltage (Vref1), and includes a voltage switch circuit (50) configured to switch the level of a voltage based on a second reference voltage (Vref2) and output the resulting voltage, a first path switch circuit (51) configured to switch between a path through which the voltage output from the voltage switch circuit is fed to the first comparator and a path through which the voltage based on the fault sensing target voltage is fed to the first comparator, and a control circuit (15) configured to control the voltage switch circuit and the path switch circuit (a first configuration).

In the first configuration described above, preferably, the voltage switch circuit (50) includes a first switch (SW_BIST_H) having one terminal connected to a first node (N4) at which a first-level voltage based on the second reference voltage (Vref2) appears and a second switch (SW_BIST_L) having one terminal connected to a second node (N5) at which a second-level voltage based on the second reference voltage appears and having the other terminal connected to the other terminal of the first switch. The first and second switches may be configured to be turned on and off by the control circuit (15) (a second configuration).

In the second configuration described above, preferably, the voltage switch circuit (50) includes a first resistor (R7) having one terminal connected to an application terminal for the second reference voltage (Vref2), a second resistor (R8) having one terminal connected to the other terminal of the first resistor at the first node (N4), and a third resistor (R9) having one terminal connected to the other terminal of the second resistor at the second node (N5) (a third configuration).

In any of the first to third configurations described above, preferably, the first path switch circuit (51) includes a third switch (SW_UVD1) that is arranged between a third node (N6) to which the voltage output from the voltage switch circuit (50) is fed and the input terminal of the first comparator (CMP1) and a fourth switch (SW_UVD2) that is arranged between a fourth node (N1) to which the voltage based on the fault sensing target voltage (Vo1) is fed and the input terminal of the first comparator (a fourth configuration).

In the fourth configuration described above, preferably, the fault detection circuit (20) includes a fourth resistor (R1) having one terminal connected to an application terminal for the fault sensing target voltage, a fifth resistor (R2) having one terminal connected to the other terminal of the fourth resistor at the fourth node (N1), a sixth resistor (R3) having one terminal connected to the other terminal of the fifth resistor at a fifth node (N2), and an NMOS transistor (NM1) having the gate driven based on the output of the first comparator and having the drain connected to the fifth node (a fifth configuration).

In any of the first to fifth configurations described above, preferably, the first reference voltage (Vref1) is fed to one input terminal of the first comparator (CMP1). The fault detection circuit (20, 19) may include a second comparator (CMP2) having one input terminal to which the first reference voltage is fed. The self-diagnosis circuit (BST1) may include a second path switch circuit (52) configured to switch between a path through which the voltage output from the voltage switch circuit (50) is fed to the other input terminal of the second comparator and a path through which the voltage based on the fault sensing target voltage (Vo1) is fed to the other input terminal of the second comparator (a sixth configuration).

In any of the first to sixth configurations described above, preferably, the fault sensing target voltage (Vo1) is the output voltage of a power supply circuit (41) (a seventh configuration).

The seventh configuration described above is, preferably, configured to perform self-diagnosis operation before the output voltage (Vo1) rises during the start-up of an IC (1) including the self-diagnosis circuit (BST1) (an eighth configuration).

According to another aspect of what is disclosed herein, a semiconductor device (1) includes the self-diagnosis circuit (BST1) according to any of the first to eighth configurations described above (a ninth configuration).

The ninth configuration described above, preferably, further includes a power supply circuit (14) for supplying electric power to a vehicle-mounted device (30). The fault sensing target voltage (Vo4) may be the output voltage of the power supply circuit (a tenth configuration).

INDUSTRIAL APPLICABILITY

The present disclosure finds application in, for example, vehicle-mounted PMICs.

LIST OF REFERENCE SIGNS

1 PMIC
2, 3 internal voltage generator
4 reference voltage generator
5 supply voltage UVLO circuit
6, 7 internal voltage UVLO circuit
8 OTP
9 TSD circuit
10 TW circuit
11, 12, 13 DC-DC circuit
14 LDO
15 control logic circuit
16 I2C input/output circuit
17 reset input/output circuit
18 warning input/output circuit
19 first overvoltage sense circuit
20 first undervoltage sense circuit
21 second overvoltage sense circuit
22 second undervoltage sense circuit
23 second undervoltage protection circuit
24 third overvoltage sense circuit
25 third undervoltage sense circuit
26 third undervoltage protection circuit
27 fourth overvoltage sense circuit
28 fourth undervoltage sense circuit
29 fourth undervoltage protection circuit
30 CMOS sensor device
41 first DC-DC converter
42 second DC-DC converter
43 third DC-DC converter
BST1 self-diagnosis circuit
CMP1, CMP2 comparator
Cb1 boot capacitor
Co1 to Co3 output capacitor
IV1, IV2 inverter
L1 to L3 inductor
NM1, NM2 NMOS transistor
R1 to R9 resistor
SW_BIST_H high-side switch
SW_BIST_L low-side switch
SW_UVD1 first path switch
SW_UVD2 second path switch
SW_OVD1 first path switch
SW_OVD2 second path switch

The invention claimed is:

1. A self-diagnosis circuit configured to diagnose a fault detection circuit that includes a first comparator configured to be fed with a voltage based on a fault sensing target voltage and a first reference voltage comprising:
a voltage switch circuit configured to switch a level of a voltage based on a second reference voltage and output a resulting voltage;
a first path switch circuit configured to switch between a path through which a voltage output from the voltage switch circuit is fed to the first comparator and a path through which the voltage based on the fault sensing target voltage is fed to the first comparator; and
a control circuit configured to control the voltage switch circuit and the path switch circuit.

2. The self-diagnosis circuit according to claim 1, wherein the voltage switch circuit includes
a first switch having one terminal connected to a first node at which a first-level voltage based on the second reference voltage appears and
a second switch having
one terminal connected to a second node at which a second-level voltage based on the second reference voltage appears and
another terminal connected to another terminal of the first switch, and
the first and second switches are turned on and off by the control circuit.

3. The self-diagnosis circuit according to claim 2, wherein the voltage switch circuit includes
a first resistor having one terminal connected to an application terminal for the second reference voltage,
a second resistor having one terminal connected to another terminal of the first resistor at the first node, and a third resistor having one terminal connected to another terminal of the second resistor at the second node.

4. The self-diagnosis circuit according to claim 1, wherein the first path switch circuit includes
- a third switch that is arranged between a third node to which the voltage output from the voltage switch circuit is fed and an input terminal of the first comparator and
- a fourth switch that is arranged between a fourth node to which the voltage based on the fault sensing target voltage is fed and the input terminal of the first comparator.

5. The self-diagnosis circuit according to claim 4, wherein the fault detection circuit includes
- a fourth resistor having one terminal connected to an application terminal for the fault sensing target voltage,
- a fifth resistor having one terminal connected to another terminal of the fourth resistor at the fourth node,
- a sixth resistor having one terminal connected to another terminal of the fifth resistor at a fifth node, and
- an NMOS transistor having
  - a gate driven based on an output of the first comparator and
  - a drain connected to the fifth node.

6. The self-diagnosis circuit according to claim 1, wherein
the first reference voltage is fed to one input terminal of the first comparator,
the fault detection circuit includes a second comparator having one input terminal to which the first reference voltage is fed, and
the self-diagnosis circuit includes a second path switch circuit configured to switch between a path through which the voltage output from the voltage switch circuit is fed to another input terminal of the second comparator and a path through which the voltage based on the fault sensing target voltage is fed to the other input terminal of the second comparator.

7. The self-diagnosis circuit according to claim 1, wherein the fault sensing target voltage is an output voltage of a power supply circuit.

8. The self-diagnosis circuit according to claim 7 configured to perform self-diagnosis operation before the output voltage rises during start-up of an IC including the self-diagnosis circuit.

9. A semiconductor device comprising the self-diagnosis circuit according to claim 1.

10. The semiconductor device according to claim 9, further comprising a power supply circuit for supplying electric power to a vehicle-mounted device, wherein the fault sensing target voltage is an output voltage of the power supply circuit.

* * * * *